US012813039B2

(12) United States Patent
Hyun

(10) Patent No.: US 12,813,039 B2
(45) Date of Patent: Nov. 24, 2026

(54) DISPLAY DEVICE AND TRANSPARENT DISPLAY DEVICE HAVING A SIDE LIGHT GENERATION PART

(71) Applicant: LG Display Co., Ltd., Seoul (KR)

(72) Inventor: Myeong Hak Hyun, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 329 days.

(21) Appl. No.: 18/543,978

(22) Filed: Dec. 18, 2023

(65) Prior Publication Data

US 2024/0258284 A1 Aug. 1, 2024

(30) Foreign Application Priority Data

Jan. 26, 2023 (KR) ........................ 10-2023-0010343

(51) Int. Cl.

| | |
|---|---|
| ***H10H 20/856*** | (2025.01) |
| ***H10H 20/831*** | (2025.01) |
| ***H10H 20/851*** | (2025.01) |
| ***H10W 90/00*** | (2026.01) |

(52) U.S. Cl.

CPC ...... *H10H 20/856* (2025.01); *H10H 20/8314* (2025.01); *H10H 20/8515* (2025.01); *H10W 90/00* (2026.01)

(58) Field of Classification Search

CPC ............. H10H 20/814; H10H 20/8314; H10H 20/833; H10H 20/835; H10H 20/8515; H10H 20/856; H10H 29/8323; H10H 29/8325; H10H 29/8515; H10H 29/856; H10K 59/121; H10K 59/124; H10K 59/38; H10K 59/50; H10K 59/80518; H10K 59/80524; H10K 59/878; H10W 90/00; H10W 90/10; H10W 90/15; H10W 90/155

See application file for complete search history.

(56) References Cited

U.S. PATENT DOCUMENTS

| | | | |
|---|---|---|---|
| 7,839,356 | B2 | 11/2010 | Hagood et al. |
| 9,158,106 | B2 | 10/2015 | Hagood et al. |
| 9,837,631 | B2 | 12/2017 | Kim et al. |
| 10,461,272 | B2 | 10/2019 | Kim et al. |
| 2006/0250325 | A1 | 11/2006 | Hagood et al. |
| 2007/0195026 | A1 | 8/2007 | Hagood et al. |

(Continued)

FOREIGN PATENT DOCUMENTS

| | | |
|---|---|---|
| KR | 10-2007-0115965 A | 12/2007 |
| KR | 10-2015-0082014 A | 7/2015 |

(Continued)

OTHER PUBLICATIONS

Ministry of Intellectual Property of Korea, Office Action, Korean Patent Application No. 10-2023-0010343, Aug. 12, 2026, seven pages, (with concise explanation of relevance).

*Primary Examiner* — Cheung Lee

(74) *Attorney, Agent, or Firm* — Fenwick & West LLP

(57) ABSTRACT

A display device according to an embodiment of the present disclosure includes a first region on a substrate, the first region having a first light emitting element emitting light upward, a second region spaced apart from the first region on the substrate, the second region including a reflective structure, and side light generation parts including a second light emitting element disposed between the first region and the second region and transmitting light to the second region.

25 Claims, 13 Drawing Sheets

(56) References Cited

U.S. PATENT DOCUMENTS

| | | | | |
|---|---|---|---|---|
| 2015/0194634 | A1* | 7/2015 | Kang | H10K 59/122 257/40 |
| 2016/0240811 | A1 | 8/2016 | Kim et al. | |
| 2018/0083221 | A1 | 3/2018 | Kim et al. | |
| 2021/0408326 | A1* | 12/2021 | Wu | H10H 20/814 |

FOREIGN PATENT DOCUMENTS

| | | | |
|---|---|---|---|
| KR | 10-2016-0101271 | A | 8/2016 |
| KR | 10-2019-0077673 | A | 7/2019 |
| KR | 10-2020-0014141 | A | 2/2020 |
| KR | 10-2020-0069214 | A | 6/2020 |

* cited by examiner

DISPLAY DEVICE AND TRANSPARENT DISPLAY DEVICE HAVING A SIDE LIGHT GENERATION PART

CROSS REFERENCE TO RELATED APPLICATIONS

This application claims the benefit of Republic of Korea Patent Application No. 10-2023-0010343, filed on Jan. 26, 2023, which is hereby incorporated by reference herein in its entirety.

BACKGROUND

Technical Field

The present disclosure relates to a display device, and includes a display device and a transparent display device including a light emitting element that generates light from the side provided between a light emitting part and a transmissive part such that light generated from the light emitting element can be selectively emitted through the transmissive part.

Discussion of the Related Art

With the development of the information society, demand for display devices for displaying images in various forms is increasing.

A light emitting display device in which pixels are composed of light emitting elements does not require a separate light source and thus is advantageous in achieving a slim or flexible configuration, and has a high color purity.

Recently, a transparent display device has been considered as a display device along with various applications.

In a known transparent display device, transmittance is adjusted by the area of a transmissive part. However, in this case, when the area of the transmissive part increases, the transmittance can be improved but the area of a light emitting part decreases, resulting in luminous efficacy decrease. In addition, since the light emitting part needs to be disposed in a limited area when the area of the transmissive part is increased, the resolution is limited.

SUMMARY

Accordingly, the present disclosure is directed to a display device and a transparent display device that substantially obviate one or more problems due to limitations and disadvantages of the related art.

A display device of the present disclosure to solve the aforementioned problem includes a light emitting display device including a light emitting element that generates light from the side between a light emitting part and a transmissive part such that light generated from the light emitting element can be selectively emitted through the transmissive part.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a display device includes a first region having a first light emitting element emitting light upward on a substrate, a second region spaced apart from the first region on the substrate and including a reflective structure, and side light generation parts including a second light emitting element disposed between the first region and the second region and transmitting light to the second region.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Figure 1:
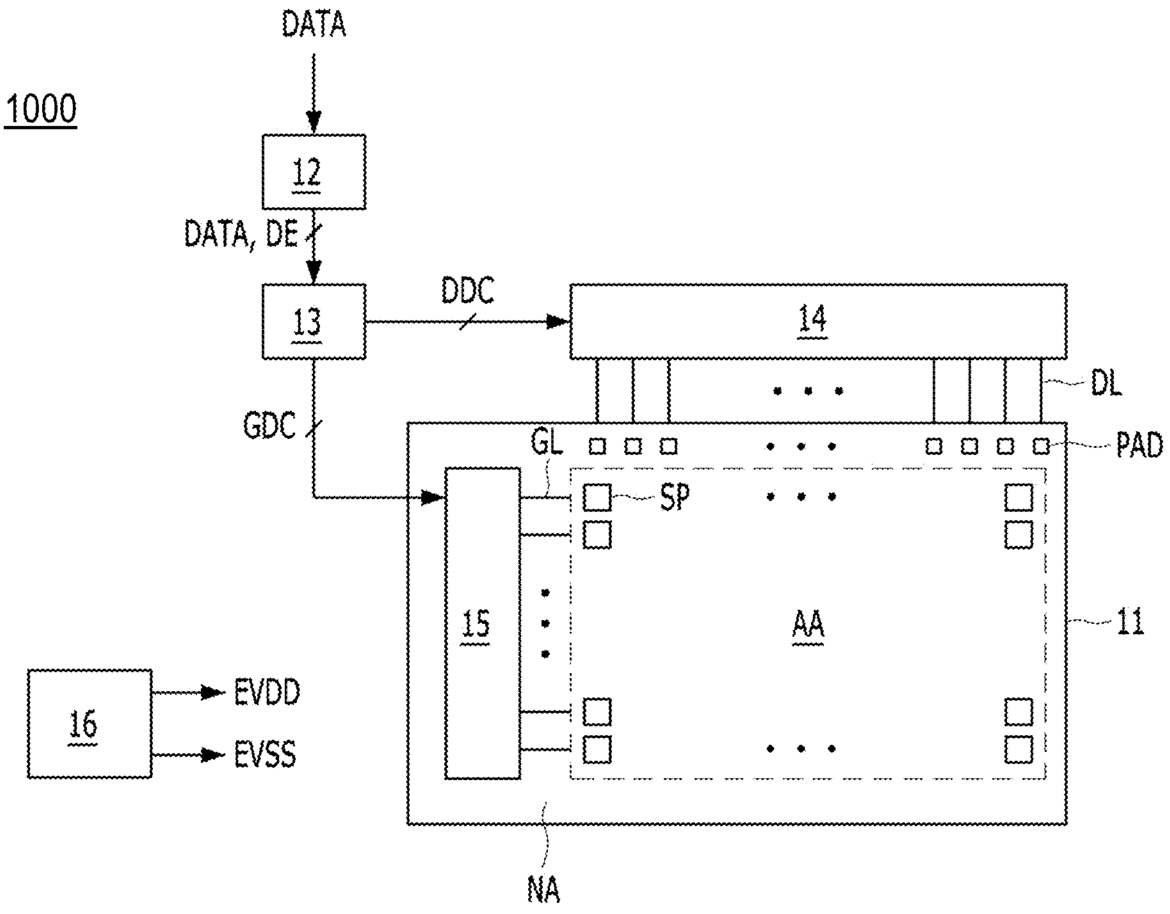
FIG. 1 is a schematic block diagram of a display device according to an embodiment of the present disclosure.

Reference will now be made in detail to example embodiments of the present disclosure, examples of which are illustrated in the accompanying drawings. Wherever possible, the same reference numbers will be used throughout the drawings to refer to the same or like parts, unless otherwise specified.

Advantages and features of the present disclosure, and a method of achieving the advantages and features will become apparent with reference to the example embodiments described herein in detail together with the accompanying drawings. The present disclosure should not be construed as limited to the example embodiments as disclosed below, and may be embodied in various different forms. Thus, these example embodiments are set forth only to make the present disclosure sufficiently complete, and to assist those skilled in the art to fully understand the scope of the present disclosure. The protected scope of the present disclosure is defined by the claims and their equivalents.

In the following description of the present disclosure, where the detailed description of the relevant known steps, elements, functions, technologies, and configurations may unnecessarily obscure an important point of the present disclosure, a detailed description of such steps, elements, functions, technologies, and configurations maybe omitted. In addition, the names of elements used in the following description are selected in consideration of clarity of description of the specification, and may differ from the names of elements of actual products. Furthermore, in the following detailed description of the present disclosure, numerous specific details are set forth in order to provide a sufficiently thorough understanding of the present disclosure. However, it will be understood that the present disclosure may be practiced without these specific details. In other instances, known methods, procedures, components, and circuits have not been described in detail so as not to unnecessarily obscure aspects of the present disclosure.

The shapes, sizes, ratios, angles, numbers, and the like, which are illustrated in the drawings to describe various example embodiments of the present disclosure are merely given by way of example. The disclosure is not limited to the illustrations in the drawings.

In the present specification, where terms such as "including," "having," "comprising," and the like are used, one or more components may be added, unless the term, such as "only," is used. As used herein, the term "and/or" includes a single associated listed item and any and all of the combinations of two or more of the associated listed items.

An expression such as "at least one of" when preceding a list of elements may modify the entire list of elements and may not modify the individual elements of the list. The term "at least one" should be understood as including any and all combinations of one or more of the associated listed items. For example, the meaning of "at least one of a first element, a second element, and a third element" encompasses the combination of all three listed elements, combinations of any two of the three elements, as well as each individual element, the first element, the second element, and the third element.

The terminology used herein is to describe particular aspects and is not intended to limit the present disclosure. As used herein, the terms "a" and "an" used to describe an element in the singular form is intended to include a plurality of elements. An element described in the singular form is intended to include a plurality of elements, and vice versa, unless the context clearly indicates otherwise.

In construing a component or numerical value, the component or the numerical value is to be construed as including an error or tolerance range even where no explicit description of such an error or tolerance range is provided.

In describing the various example embodiments of the present disclosure, where the positional relationship between two elements is described using terms, such as "on", "above", "under" and "next to", at least one intervening element may be present between the two elements, unless "immediate(ly)" or "direct(ly)" or "close(ly)" is used. It will be understood that when an element or layer is referred to as being "connected to", or "coupled to" another element or layer, it may be directly connected to or coupled to the other element or layer, or one or more intervening elements or layers may be present.

In describing the various example embodiments of the present disclosure, when terms such as "after," "subsequently," "next," and "before," are used to describe the temporal relationship between two events, another event may occur therebetween, unless a more limiting term, such as "just," "immediate(ly)," or "directly" is used.

In describing the various example embodiments of the present disclosure, terms such as "first" and "second" may be used to describe a variety of components. These terms aim to distinguish the same or similar components from one another and do not limit the components. Accordingly, throughout the specification, a "first" component may be the same as a "second" component within the technical concept of the present disclosure, unless specifically mentioned otherwise.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in a co-dependent relationship.

Hereinafter, a display device and a transparent display device of the present disclosure will be described with reference to the drawings.

FIG. 1 is a schematic block diagram of a display device 1000 according to an embodiment of the present disclosure.

As illustrated in FIG. 1, the display device 1000 according to an embodiment of the present disclosure may include a display panel 11, an image processor 12, a timing controller 13, a data driver 14, a scan driver 15, and a power supply 16.

The display panel 11 may display an image in response to a data signal DATA supplied from the data driver 14, a scan signal supplied from the scan driver 15, and power supplied from the power supply 16.

The display panel 11 may include sub-pixels SP disposed at intersections of a plurality of gate lines GL and a plurality of data lines DL. The structure of the sub-pixels SP may be changed in various manners according to the type of the display device 1000.

In the display device 1000 of the present disclosure, each of the sub-pixels SP is capable of light emission and transmission. The sub-pixels SP refer to units capable of emitting light of respective colors with or without a specific type of color filter. For example, the sub-pixels SP may include a red sub-pixel, a green sub-pixel, and a blue sub-pixel. Alternatively, the sub-pixels SP may include, for example, a red sub-pixel, a blue sub-pixel, a white sub-pixel, and a green sub-pixel. The sub-pixels SP may have one or more different emission areas according to light emission characteristics. For example, a blue sub-pixel and sub-pixels emitting different colors may have different emission areas.

One or more sub-pixels SP may constitute one unit pixel. For example, one unit pixel may include red, green, and blue sub-pixels, and the red, green, and blue sub-pixels may be repeatedly disposed therein. Alternatively, one unit pixel may include red, green, blue, and white sub-pixels, and the red, green, blue, and white sub-pixels may be repeatedly disposed or may be disposed in a quad type. In an embodiment according to the present disclosure, the sub-pixels may have various color types, arrangement types, and arrangement orders according to light emission characteristics, device lifespan, and device specifications, and the present disclosure is not limited thereto.

The display panel 11 may be divided into a display area AA in which the sub-pixels SP are disposed to display an image, and a non-display area NA around the display area AA. The scan driver 15 may be provided in the non-display area NA of the display panel 11. In addition, the non-display area NA may include a pad part including a pad electrode PAD.

The image processor 12 may output a data enable signal DE along with an externally supplied data signal DATA. The image processor 12 may output one or more of a vertical sync signal, a horizontal sync signal, and a clock signal in addition to the data enable signal DE, but illustration of these signals is omitted for convenience of description.

The timing controller 13 may receive the data signal DATA along driving signals from the image processor 12. The driving signals may include the data enable signal DE. Alternatively, the driving signals may include the vertical sync signal, the horizontal sync signal, and the clock signal. The timing controller 13 may output a data timing control signal DDC for controlling the operation timing of the data driver 14 and a gate timing control signal GDC for controlling the operation timing of the scan driver 15 on the basis of the driving signals.

The data driver 14 may sample and latch the data signal DATA supplied from the timing controller 13 in response to the data timing control signal DDC supplied from the timing controller 13, convert the same into a gamma reference voltage, and output the gamma reference signal.

The data driver 14 may output the data signal DATA through the data lines DL. The data driver 14 may be implemented in the form of an integrated circuit (IC). For example, the data driver 14 may be electrically connected to the pad electrode PD disposed in the non-display area NA of the display panel 11 through a flexible circuit film (not shown).

The scan driver 15 may output a scan signal in response to the gate timing control signal GDC supplied from the timing controller 13. The scan driver 15 may output scan signals through the gate lines GL. The scan driver 15 may be implemented in the form of an integrated circuit (IC) or implemented in a gate-in-panel structure in the display panel 11.

The power supply 16 may output a high-potential voltage and a low-potential voltage for driving the display panel 11. The power supply 16 may supply the high-potential voltage to the display panel 11 through a first power line EVDD (driving power line or pixel power line), and may supply the low-potential voltage to the display panel 11 through a second power line EVSS (auxiliary power line or common power line).

The display panel 11 is divided into the display area AA and the non-display area NA, and may include a plurality of sub-pixels SP defined in a matrix form by gate lines GL and data lines DL intersecting each other in a matrix form in the display area AA.

The sub-pixels SP may include sub-pixels emitting at least two of red light, green light, blue light, yellow light, magenta light, and cyan light. Further, the plurality of sub-pixels SP may emit respective colors with or without a specific type of color filter. However, the present disclosure is not necessarily limited thereto, and the sub-pixels SP may have various color types, arrangement types, and arrangement orders according to light emission characteristics, device lifespan, device specifications, and the like.

Hereinafter, the internal configuration of the sub-pixels of the display device according to the present disclosure will be described with reference to the drawings.

Figure 2:
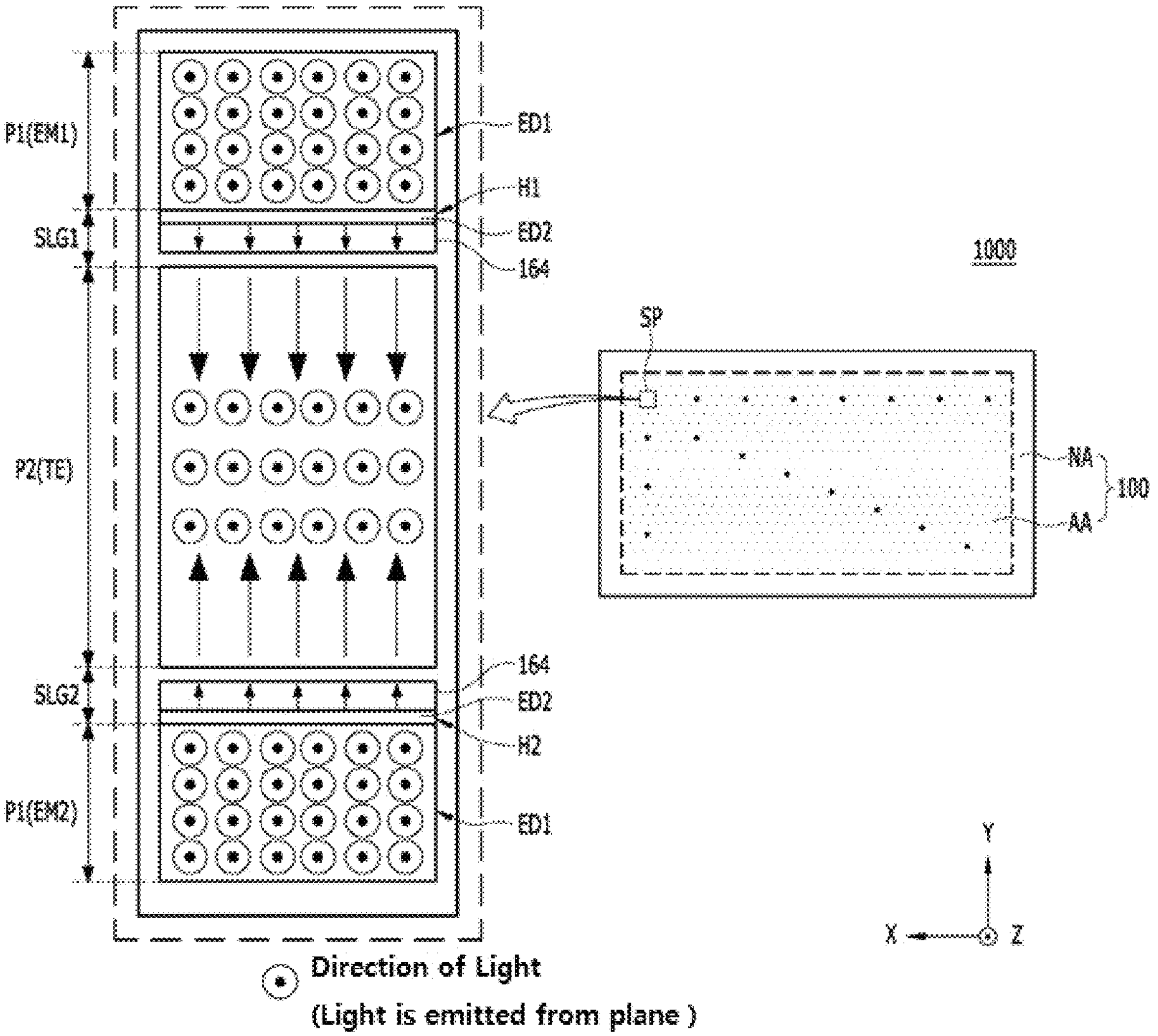
FIG. 2 is a plan view illustrating a display device according to an embodiment of the present disclosure.
Figure 3:
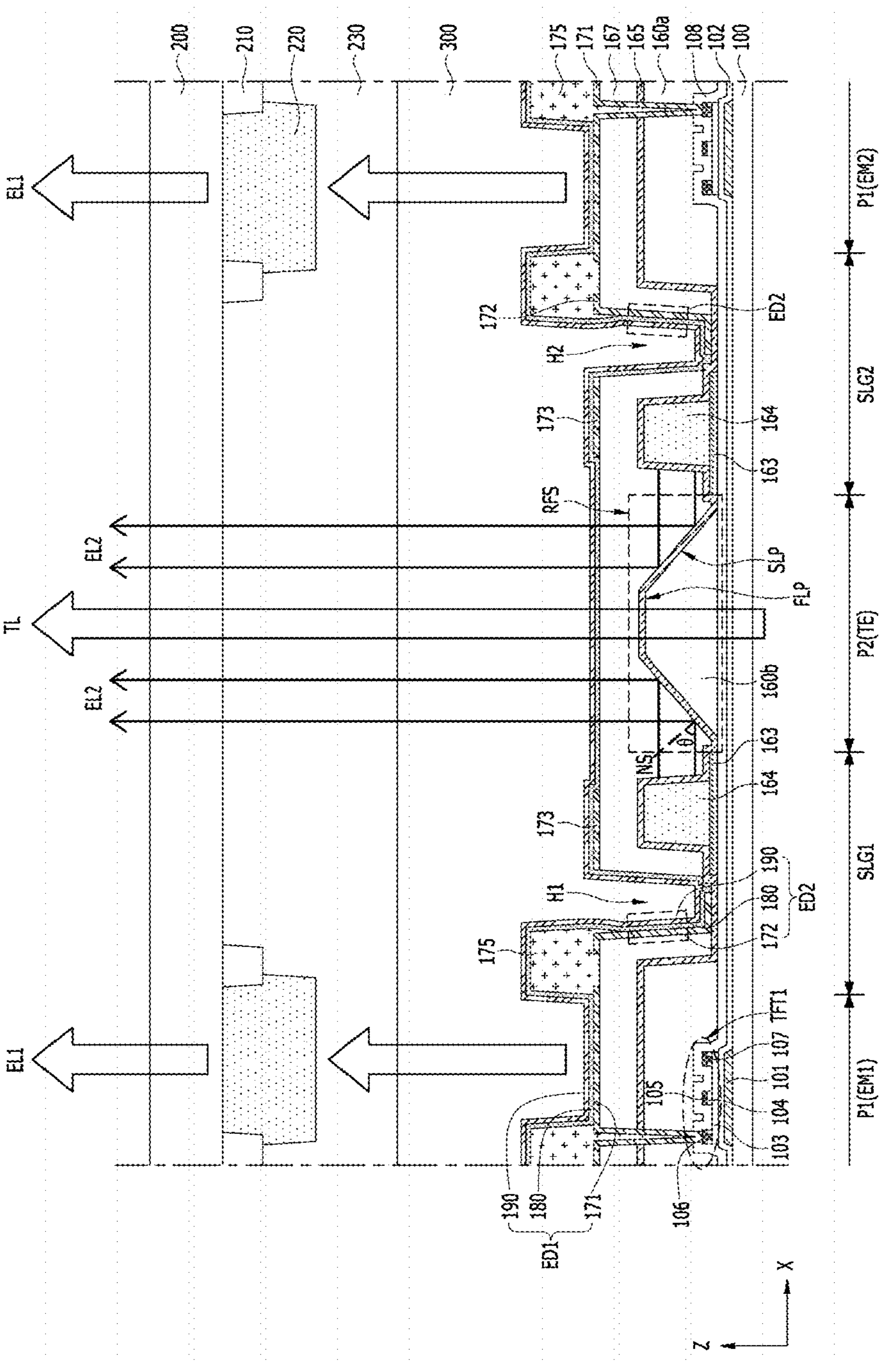
FIG. 3 is a cross-sectional view of a sub-pixel of FIG. 2 in the Y-axis direction according to an embodiment of the present disclosure.

FIG. 2 is a plan view illustrating the display device according to an embodiment of the present disclosure. FIG. 3 is a cross-sectional view of one sub-pixel shown in FIG. 2 in the Y-axis direction.

As illustrated in FIGS. 2 and 3, the display device 1000 according to an embodiment of the present disclosure includes a substrate 100 including a display area AA in which a plurality of sub-pixels SP is disposed and a non-display area NA positioned around the display area AA.

Each sub-pixel SP includes a first region P1 having a first light emitting element ED1 emitting light, a second region P2 having a reflective structure RFS on the substrate 100 and spaced apart from the first region P1, and side light generation parts SGL1 and SGL2 positioned between the first region P1 and the second region P2 and transmitting light to the second region.

Here, the first region P1 is provided on both sides of the second region P2 and includes a first light emitting element ED1, and light EL1 emitted from the first light emitting element ED is radiated along the Z axis in the vertical direction perpendicular to the X-Y plane. FIG. 3 shows that the first region P1 on the left side is a first light emitting part EM1, and the second region P2 on the right side is a second light emitting part EM2.

The first light emitting element ED1 of the first region P1 is connected to a thin film transistor TFT1 and operates by receiving an electrical signal.

Here, the first light emitting element ED1 may include a first electrode 171, an interlayer 180, and a second electrode 190.

Since light EL1 from the first light emitting element ED1 is emitted from the upper side of the substrate 100, the first electrode 171 is a reflective electrode and the second electrode 190 is transparent electrode or a reflective-transmissive electrode in order to increase light emission efficiency. If the second electrode 190 is a transparent electrode, the second electrode 190 transmits light emitted from the interlayer 180 according to the transparency of the transparent electrode. If the second electrode 190 is a reflective-transmissive electrode, light having a predetermined wavelength suitable for optimum resonance conditions is emitted through the second electrode 190 of the first light emitting element ED1 through repeated reflection and re-reflection between the first electrode 171 and the second electrode 190.

The interlayer 180 may be composed of a single emission layer or may include an emission layer and one or more functional layers. For example, the interlayer 180 may include a hole injection layer, a hole transport layer, an emission layer, an electron transport layer, and an electron injection layer. As another example, the interlayer 180 may include a plurality of stacks and a charge generation layer disposed between the plurality of stacks. Here, each of the plurality of stacks may include a hole transport layer, an emission layer, and an electron transport layer.

The first light emitting element ED1 may be, for example, a light emitting element emitting white light. In this case, when the interlayer 180 includes a plurality of emission layer, light emitted from the emission layers may be combined and thus white light may be finally emitted. For example, the interlayer of the first light emitting element ED1 may include at least one stack including a blue emission layer, at least one stack including red and green emission layers, and/or a stack including a yellow green emission layer. If the interlayer 180 includes a single emission layer, the emission layer may be an emission layer that directly emits white light.

When the first light emitting element ED1 is a light emitting element emitting white light, a color converter 220 such as a color filter may be provided on an area of an opposing substrate 200 corresponding to the first light emitting element ED1 to adjust the color of light emitted from the corresponding sub-pixel. For example, the color converter 220 may be one of a red color filter, a green color filter, and a blue color filter. However, in the display device of the present disclosure, the color converter 220 is not limited to a combination of red, green, and blue. Combinations of other colors are also possible according to color expression to be implemented by the display device. As another example, cyan, magenta, yellow, etc. may be used.

The second region P2 includes a reflective structure RFS, and each component of the reflective structure RFS is made of a transparent material such that propagation of light from the bottom of the substrate 100 is not obstructed. The reflective structure RFS also has a function of receiving side light from the side light generation parts SLG1 and SLG2 through the second light emitting element ED2 and reflecting the same upward. Here, an inclined part of the reflective structure RFS may totally reflect side light upward.

The reflective structure RFS may include, on the substrate 100, an inclined part **160*b* inclined toward the side light generation parts SLG1 and SGL2, and a total reflection inducing layer 165 having a lower refractive index than the inclined part and disposed on the inclined part. The total reflection inducing layer 165 is formed of a transparent inorganic insulating material along the sloping portion of the inclined part 160*b*, and is formed much thinner than the inclined part 160*b*. The total reflection inducing layer 165 may be formed on the entire surface of the substrate 100 to execute a function of protecting other components formed on the substrate 100 in areas other than the inclined part 160*b*** of the total reflection structure RFS.

The inclined part **160*b* may be formed of, for example, at least one of organic materials such as photo acryl, polyimide, benzocyclobutene resin, and acrylate. In addition, the total reflection inducing layer 165 is formed along the side surface SLP of the inclined part 160*b*, and it is desirable that the total reflection inducing layer 165 be made of a transparent inorganic insulating material having a lower refractive index than the transparent organic insulating material of the inclined part 160*b* in order to re-reflect light from the side of the inclined part 160*b* and transmit the same upward. For example, the total reflection inducing layer 165** may be made of a transparent inorganic insulating material having a low refractive index such as silicon oxide ($SiO2$).

When viewed in cross section, the inclined part **160*b*** may have a prism shape.

The second region P2 including the total reflection structure RFS may emit transmitted light TL that has passed through the substrate 100 from the bottom of the substrate 100. In addition, when the first region P1 emits light, light is received from the second light emitting element ED2 that emits light in the lateral direction, provided in the side light generation parts SLG1 and SLG2, and totally reflected upward by the sloping portion SLP of the total reflection structure RFS to increase light emission efficiency in sub-pixels. That is, the side light generation parts SLG1 and SLG2, which are different from the second region P2 serving as a transmissive part TE, generate side light, and this side light is transferred to the second region P2 and totally reflected to be used to increase light emission efficiency without increasing the area of the first and second light emitting parts EM1 and EM2 of the first region P1.

Meanwhile, the side light generation parts SLG1 and SGL2 include the second light emitting elements ED2 formed in the Z-axis direction by being stacked on the sidewalls of holes H1 and H2 of a planarization layer 167. The second light emitting elements ED2 are spaced apart from the first electrode 171 and provided on portions of the sidewalls of the holes H1 and H2 of the planarization layer, which are adjacent to the first region P1. The second light emitting elements ED2 include a third electrode 172, an interlayer 180, and a second electrode 190 sequentially provided on the sidewalls of the holes H1 and H2 of the planarization layer 167.

Here, the first interlayer 180 of the first light emitting element ED1 and the interlayer 180 of the second light emitting element ED2 may be integrated, and the second electrode 190 of the first light emitting element ED1 and the second electrode 190 of the second light emitting element ED2 may be integrated.

The areas of the first light emitting element ED1 and the second light emitting element ED2 may be divided by a bank 175. However, since the planes on which the first light emitting element ED1 and the second light emitting element ED2 are formed are different as the X-Y plane and the Z-axis plane in the display device of the present disclosure, there is almost no interference between the areas, and thus the bank 175 serving as a structure exposing the light emitting parts may be omitted between the first light emitting element ED1 and the second light emitting element ED2.

A connection structure between the first light emitting part EM1 and the first side light generation part SLG1 is as follows.

The interlayer 180 and the second electrode 190 of the first light emitting element ED1 are formed flat on the first electrode 171 in the first region P1, extend on one side, the upper side, and the other side of the bank 175, and are formed on one sidewall of the hole H1 of the planarization layer 167, which is connected to one side of the bank 175 in the Z-axis direction. The interlayer 180 and the second electrode 190 extend to the bottom surfaces and other sidewalls of the holes H1 and H2 and to the second region P2. The interlayer 180 and the second electrode 190 are formed on the second light emitting part EM2 of the second region symmetrically with the first light emitting part EM1 of the first region.

In the display device of the present disclosure, the interlayer 180 and the second electrode 190 may be continuous in the sub-pixel partitioned into the first region, the side light generation parts, and the second region and may also be continuous in the plurality of sub-pixels SP. The interlayer 180 and the second electrode 190 may be formed at least on the display area AA using an open mask. If the interlayer 180 includes an emission layer and a plurality of functional layers, at least one of the emission layer and the plurality of functional layers may be formed by being selectively left in a portion corresponding to the first region P1 through an opening of a fine metal mask.

The first and second light emitting elements ED1 and ED2 are formed with the first electrode 171 and the second electrode 172 spaced apart from each other, and can be independently driven by being connected to thin film transistors independent of each other.

In some cases, the first and second light emitting elements ED1 and ED2 may operate simultaneously by connecting the first electrode 171 and the second electrode 172 to the same thin film transistor. In this case, when light is emitted from the first light emitting element ED1, side light is generated from the second light emitting element ED2 and reflected or totally reflected through the second region P2, and thus light EL2 caused by light emission of the second light emitting element ED2 is emitted upward.

Hereinafter, unexplained components on the substrate 100 will be described.

The first and second light emitting elements ED1 and ED2 are connected to thin film transistors, respectively. For example, as illustrated in FIG. 3, a thin film transistor TFT1 includes a semiconductor layer 103, a gate electrode 105 overlapping a channel of the semiconductor layer 103 having a gate insulating layer 104 interposed therebetween, and a source electrode 106 and a drain electrode 107 connected to the semiconductor layer 103.

The source electrode 106 or the drain electrode 107 of the semiconductor layer 103 may be connected to the first electrode 171 and/or the second electrode 172.

The semiconductor layer 103 may include at least one of an oxide semiconductor, amorphous silicon, and crystalline silicon.

A light blocking layer 101 may be further provided below the semiconductor layer 103 to prevent or at least reduce light coming from the bottom of the substrate 100 from affecting the semiconductor layer 103.

A buffer layer 102 may be further provided between the light blocking layer 101 and the semiconductor layer 103.

An inorganic passivation layer 108 and an organic passivation layer 160*a* may be sequentially formed to protect the thin film transistor TFT1.

The buffer layer 102 and the inorganic protective layer 108 may be, for example, any one of a silicon oxide layer, a silicon nitride layer, a silicon oxynitride layer, a metal oxide layer, and a metal nitride layer.

Here, the organic passivation layer 160*a* may be made of the same material as the inclined part 160*b* of the total reflection structure RFS of the second region P2. The organic passivation layer 160*a* is thicker than the inorganic passivation layer 108 and may have the same thickness as the height of the top of the inclined part 160*b*. For example, the inclined part 160*b* is formed by coating a photosensitive organic passivation material on the entire area of the substrate 100 to a predetermined thickness, and then exposing the material corresponding to the area where the sloping portion SLP is to be formed with an exposure amount with gradation such that the inclined part 160*b* is formed in a shape in which the thickness sequentially increases between the bottom surface of the passivation layer 160*a* and the top of the inclined part. Although FIG. 3 shows an example in which the inclined part 160*b* has a single sloping portion SLP on both sides thereof, the present disclosure is not limited thereto, and the total reflection structure RFS may be formed in a step shape in which the inclined part 160*b* includes a plurality of sloping portions SLP and flat portions provided between the plurality of sloping portions SLP. The step-shaped total reflection structure RFS will be described later.

The thin total reflection inducing layer 165 is formed on the inclined part 160*b*, and the total reflection inducing layer 165 may extend to other areas of the substrate 100 and be formed on the entire surface.

The planarization layer 167 may be provided to cover the total reflection inducing layer 165.

The planarization layer 167, the inclined part 160*b*, and the organic passivation layer 160*a* may be made of the same material. The refractive index of the planarization layer 167 is greater than that of the total reflection inducing layer 165. Accordingly, light generated from the second light emitting element ED2 and traveling to the side toward the second region P2 can be totally reflected when having an incidence angle equal to or less than a critical angle with respect to the normal NS perpendicular to the surface of the sloping portion SLP of the inclined part. That is, the total reflection structure RFS has a sloping portion such that light incident in the lateral direction has an acute angle of incidence with respect to the sloping portion, and light reflected at the same acute angle as the incidence angle with respect to the normal NS perpendicular to the surface of the sloping portion SLP of the inclined part is directed toward the upper side of the substrate 100. Accordingly, most of the light incident in the lateral direction can be emitted upward, thereby improving light emission efficiency.

An encapsulation layer 300 may be provided on the first light emitting element ED1 of the substrate 100 to protect lower components such as the first light emitting element ED1, the second light emitting element ED2, and the thin film transistor TFT1. The encapsulation layer 300 may include at least one of an inorganic encapsulation layer and an organic encapsulation layer.

In addition, the opposing substrate 200 including a first color converter 220 facing the first light emitting element ED1 of the substrate 100 may be further provided to face the substrate 100.

The opposing substrate 200 may further include a black matrix 210 overlapping the bank 175. The black matrix 210 may overlap the side light generation parts SLG1 and SLG2 between the first region P1 and the second region P2. In some cases, the black matrix 210 may be omitted from the display device of the present disclosure.

An overcoat layer 230 may be provided on the entire surface of the opposing substrate 200 facing the substrate 100 to be in flat contact with the encapsulation layer 300 of the substrate 100.

In some cases, the opposing substrate 200 may be omitted, and the black matrix 210 and the overcoat layer 230 may be directly formed on the encapsulation layer 300.

Since the region of the opposing substrate 200 corresponding to the second region P2 does not have the black matrix 210 and the first color converter 220, the transmitted light TL from the bottom of the substrate 100 can pass through the opposing substrate 200 without passing through light limiting elements. Components of the region through which the transmitted light TL passes are all made of transparent materials. Further, it is desirable that the total reflection structure RFS have a flat surface FLP to prevent or at least reduce interfacial reflection of the transmitted light TL at the total reflection structure RFS through which the transmitted light passes. Since the total reflection structure RFS has the sloping portions SLP to re-reflect side light, the flat portions FLP may be provided between the sloping portions SLP.

The second light EL2 emitted from the second light emitting element ED2 may be simultaneously generated when the first light emitting element ED1 emits light. At this time, as illustrated in FIG. 3, a side light transmitted to the second region P2 may be reflected by the total reflection inducing layer 165 on the sloping portion SLP of the total reflection structure RFS and emitted upward.

In some cases, a filling material or a face seal may be added between the overcoat layer 230 and the encapsulation layer 300.

A second color converter 164 may be further provided in an area where the second light generated from the second light emitting element ED2 travels in the lateral direction. The first color converter 220 and the second color converter 164 may have selective transmittance for a wavelength range of the same color and a light blocking property for other wavelength range of another colors. For example, if the first color converter 220 positioned in the first region P1 in one sub-pixel SP is a red color filter, the second color converter 164 provided in the side light generation parts SLG1 and SLG2 may also be a red color filter having the same selective transmittance. Therefore, if the display device includes a red sub-pixel, a green sub-pixel, and a blue sub-pixel provided on the substrate 100, the red sub-pixel may include a red color filter in the first region P1 and the side light generation parts SLG1 and SLG2, the green sub-pixel may include a green color filter in the first region P1 and the side light generation parts SLG1 and SLG2, and the blue sub-pixel may include a blue color filter in the first region P1 and the side light generation parts SLG1 and SLG2.

The color converter having selective transmittance for wavelengths of the same color is provided in the first region P1 and the side light generation parts SLG1 and SLG2 in each sub-pixel in order to cause light traveling in the lateral direction, totally reflected and emitted upward in the second region P2 to have the same color as light passing through the first color converter 220 through the first light emitting element ED1, to improve the light emission efficiency of the corresponding sub-pixel.

Here, the first and second light emitting elements ED1 and ED2 may emit white light.

However, the display device of the present disclosure is not limited thereto. For example, the first and second light emitting elements ED1 and ED2 may include emission layers emitting light of a color of the corresponding sub-pixel in the interlayer 180. In this case, the first and second light emitting elements ED1 and ED2 may include emission layers emitting the same color in one sub-pixel SP. That is, the red sub-pixel may include a red emission layer in the interlayer of the first region P1 and the side light generation parts SLG1 and SLG2, the green sub-pixel may include a green emission layer in the interlayer of the first region P1 and the side light generation parts SLG1 and SLG2, and the blue sub-pixel may include a blue emission layer the interlayer of the first region P1 and the side light generation parts SLG1 and SLG2.

In this case, the first and second color converters 220 and 164 may be omitted. By omitting the first color converter 220, the configuration of the opposing substrate 200 may be simplified or the opposing substrate 200 may be omitted. In addition, by omitting the second color converter 164, the widths of the side light generation parts SLG1 and SLG2 can be reduced to increase the area of the second region P2 where transmitted light is emitted, thereby improving transmission efficiency.

The side light generation parts SLG1 and SLG2 may further include a first reflector 163 and a second reflector 173 on the lower and upper surfaces of the second color converter 164 such that light generated from the second light emitting element ED2 is transmitted to the second region P2 without being lost in the display device. The first and second reflectors 163 and 173 re-reflect light which is not horizontal and thus is directed toward the upper or lower surface of the planarization layer 167, among the light generated from the second light emitting element ED2 and transmitted in the lateral direction, to the inside of the planarization layer 167 such that it reaches the surface of the total reflection inducing layer 165 formed along the sloping portion SLP of the inclined part 160*b*, thereby increasing the amount of upward emission of the second light EL2.

If the second reflector 173 is formed on the planarization layer 167, it may be formed in the same process as the first electrode 171.

The planarization layer 167 may include the organic passivation layer 160*a* spaced apart from the holes H1 and H2 therein to secure the length of the sidewalls of the holes H1 and H2 where the second light emitting element ED2 generation side light is formed. In this case, the upper surface of the total reflection inducing layer 165 formed on the entire surface of the substrate may be exposed at the bottoms of the holes H1 and H2 of the planarization layer 167.

The encapsulation layer 300 may be formed to reach the inside of the holes of the planarization layer 167. The encapsulation layer 300 is formed of a transparent material. Therefore, the light generated from the second light emitting element ED2 and transmitted in the lateral direction maintains the propagation direction in the encapsulation layer 300, passes through the transmissive interlayer 180 and the second electrode 190 on the other sidewall of the planarization layer 167 adjacent to the neighboring second region with the light path unchanged, and is transmitted to the second region P2 through the second color converter 164.

A plurality of first regions P1 may be disposed on the substrate 100, and the second region P2 having the transmissive part may be disposed between the plurality of first regions P1.

Hereinafter, specific embodiments of the display device of the present disclosure will be described with reference to the drawings.

Figure 4:
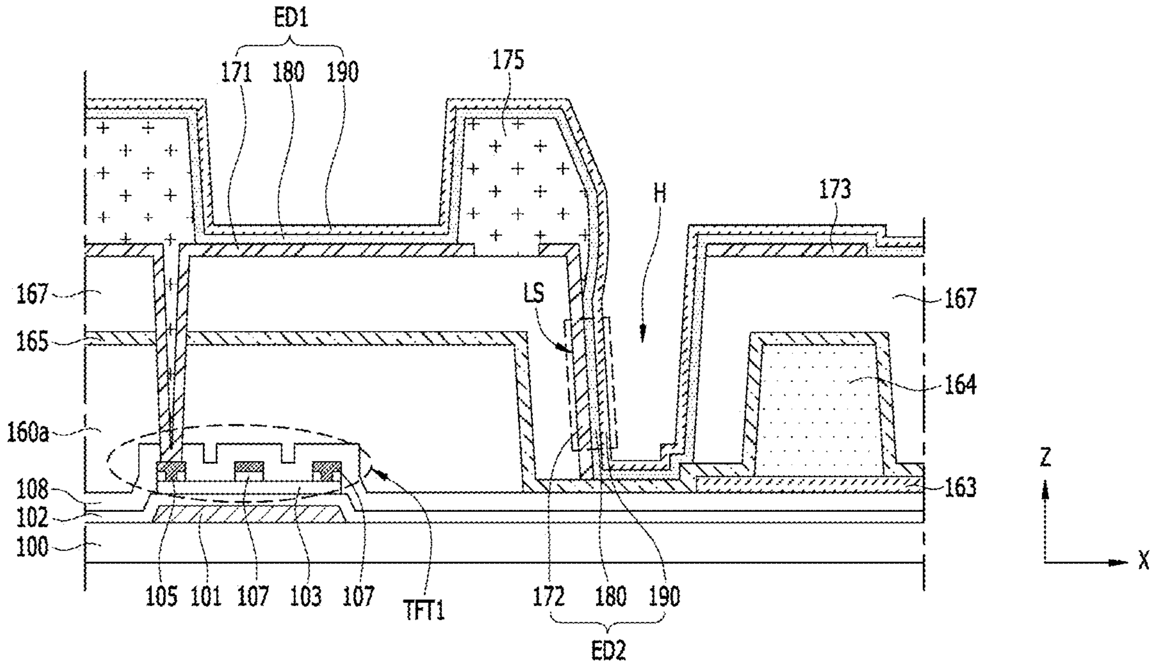
FIG. 4 is a cross-sectional view illustrating a first region and a side light generation part in a display device according to a first embodiment of the present disclosure.

FIG. 4 is a cross-sectional view illustrating a first region and side light generation parts in a display device according to a first embodiment of the present disclosure.

As illustrated in FIG. 4, in the display device according to the first embodiment of the present disclosure, the first region P1 includes the first light emitting element ED1 and directly emits the first light from the first light emitting element ED1 upward. In the side light generation parts (refer to SLG1 and SLG2 in FIG. 2), side light is generated through the second light emitting element ED2 formed on the sidewall of a hole H provided in the planarization layer 167 and transmitted to the second region P2.

Here, the second light emitting element ED2 includes the third electrode 172, the interlayer 180, and the second electrode 190 which are sequentially formed, and the sidewall LS of the hole H is almost vertical and thus light generated from the second light emitting element ED2 is transmitted to the second region P2 in a direction perpendicular to the sidewall LS, that is, in the horizontal direction that is the X-axis or Y-axis direction. In order to prevent or at least reduce light generated from the second light emitting element ED2 from escaping to the first region P1, the third electrode 172 may include a reflective electrode. Therefore, even if some light generated in the interlayer 180 of the second light emitting element ED2 is directed to the first region P1, the light may be reflected from the surface of the third electrode 172 and returned to the second region P1 to be used.

The third electrode 172 is provided on the entire sidewall LS of the hole H1 of the planarization layer 167 adjacent to the first region P1, and thus side light can be generated over the entire length of the sidewall LS.

The display device according to the first embodiment of the present disclosure includes the first reflector 163 and the second reflector 173 provided below and on the planarization layer 167.

Accordingly, when the hole H provided in the planarization layer 167 is not completely perpendicular to the surface of the substrate 100 and has an acute angle of inclination, light generated from the second light emitting element ED2 is transmitted to the second region P2 without being lost inside the display device in the side light generation parts SLG1 and SLG2. That is, the first reflector 163 and the second reflector 173 may be further provided on the lower and upper surfaces of the second color converter 164. The first and second reflectors 163 and 173 re-reflect light which is not horizontal and thus is directed toward the upper or lower surface of the planarization layer 167, among the light generated from the second light emitting element ED2 and transmitted in the lateral direction, to the inside of the planarization layer 167 such that it reaches the surface of the total reflection inducing layer 165 formed along the sloping portion SLP of the inclined part 160*b*, thereby increasing the amount of upward emission of the second light EL2.

Figure 5:
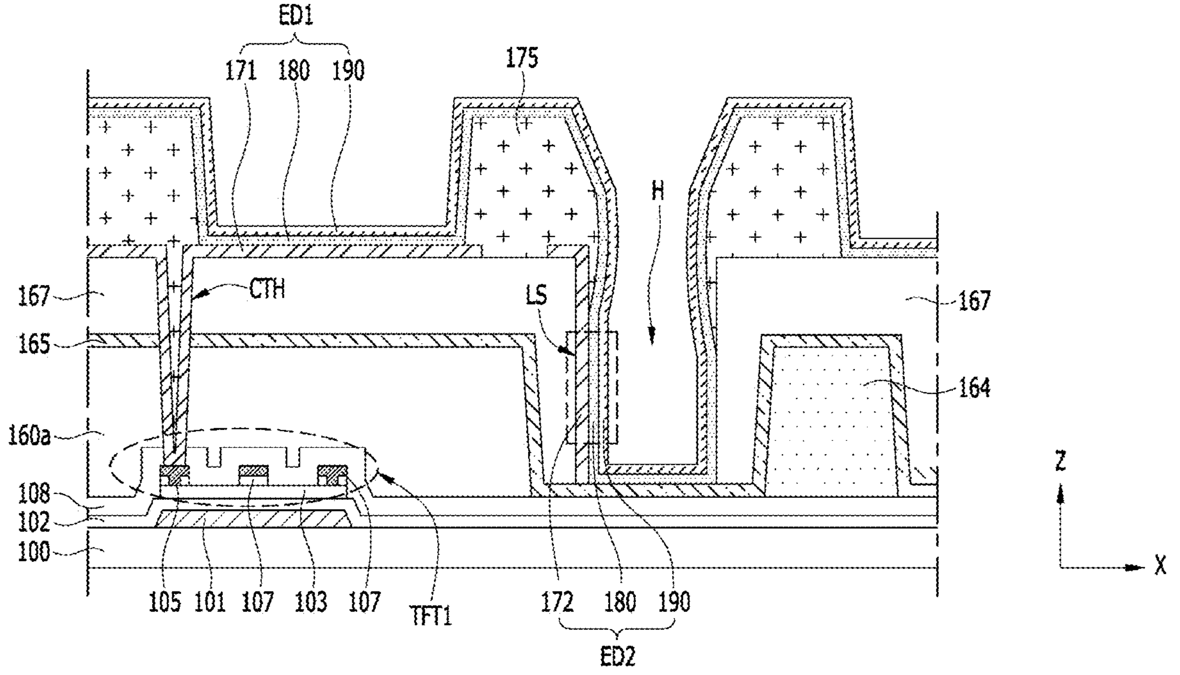
FIG. 5 is a cross-sectional view illustrating a first region and a side light generation part in a display device according to a second embodiment of the present disclosure.

FIG. 5 is a cross-sectional view illustrating a first region and side light generation parts in a display device according to a second embodiment of the present disclosure.

As illustrated in FIG. 5, in the display device according to the second embodiment of the present disclosure, the hole H of the planarization layer 165 is vertically formed using dry etching or the like. In this case, the light emitted from the second light emitting element ED2 travels in a direction perpendicular to the sidewall of the hole H, and there is almost no light directed to the upper or lower surface of the planarization layer 167, and thus the first and second reflectors can be omitted, differently from the first embodiment.

Here, since the first and second reflectors are omitted, the display device according to the second embodiment may further include the bank 175 overlapping the second color converter 164.

Figure 6:
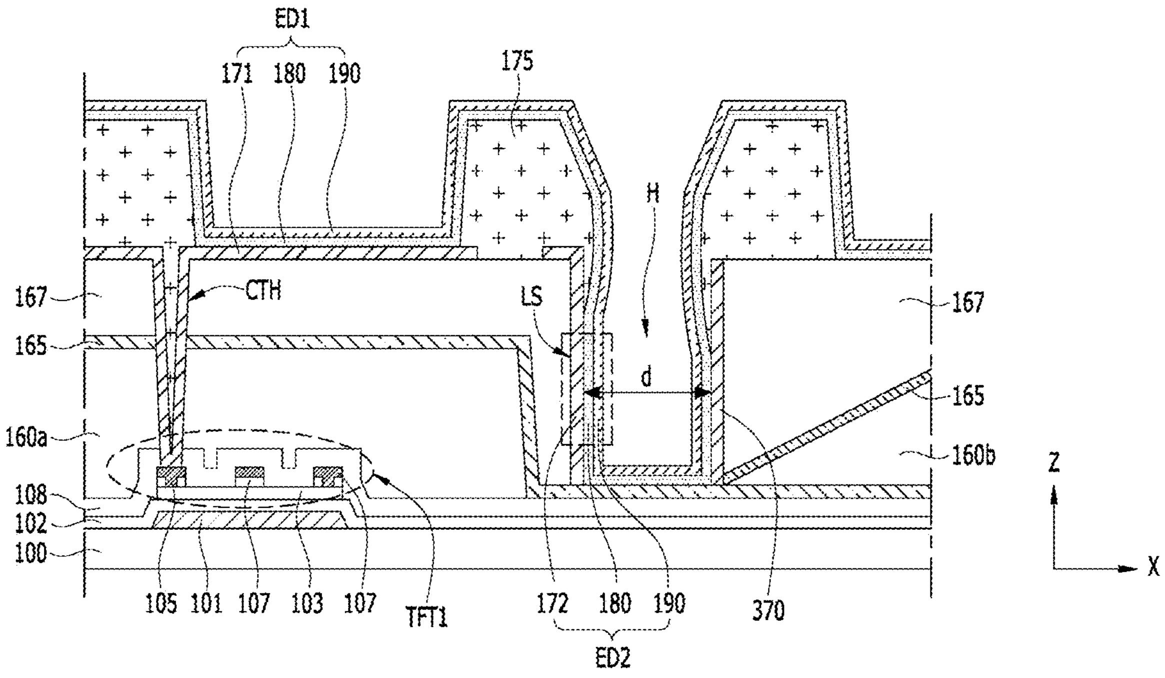
FIG. 6 is a cross-sectional view illustrating a first region and a side light generation part in a display device according to a third embodiment of the present disclosure.
Figure 7:
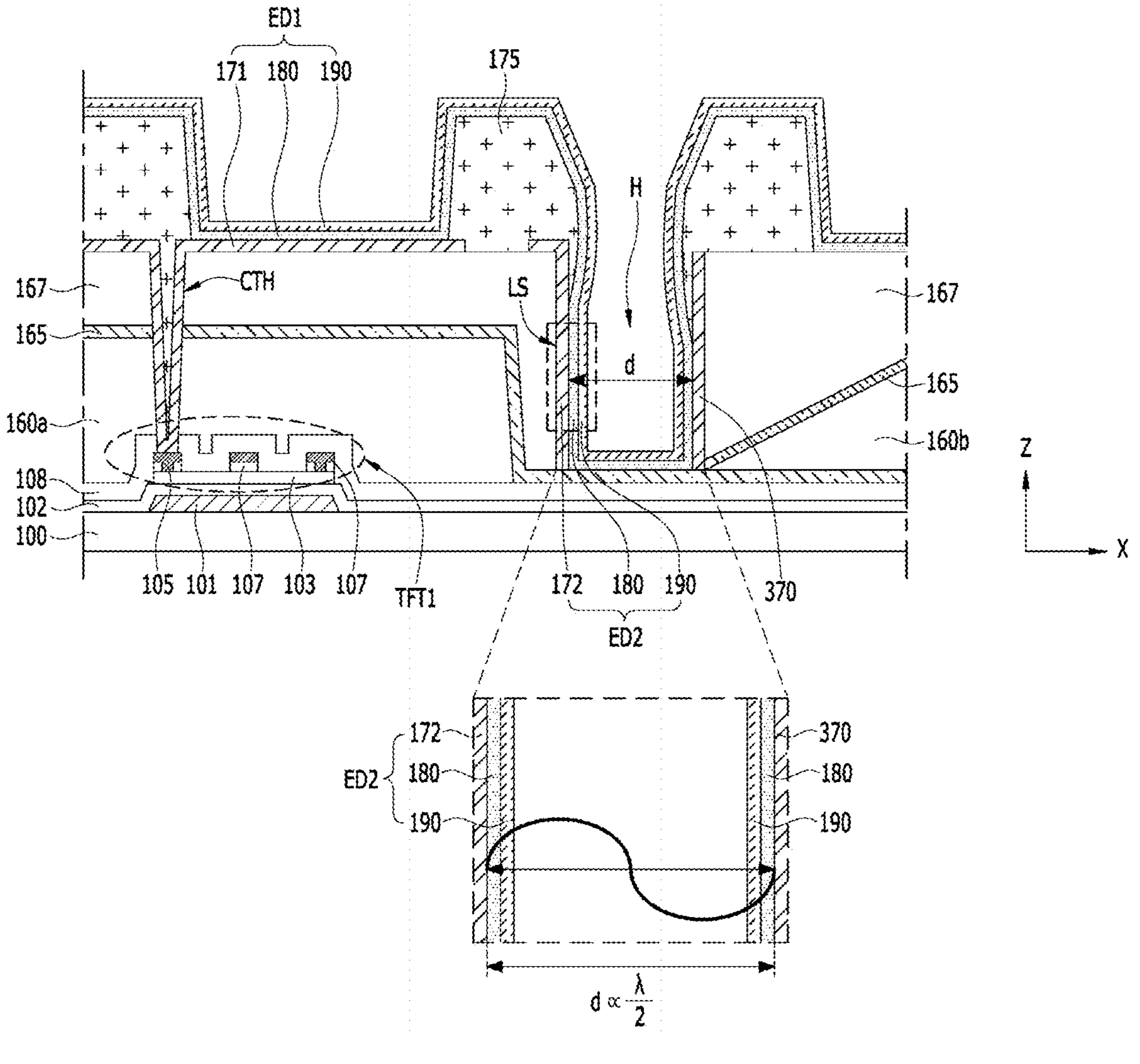
FIG. 7 is a schematic cross-sectional view illustrating a structure on a sidewall structure of a hole region of FIG. 6 and a resonance principle thereof according to an embodiment of the present disclosure.

FIG. 6 is a cross-sectional view illustrating a first region and side light generation parts in a display device according to a third embodiment of the present disclosure, and FIG. 7 is a schematic cross-sectional view illustrating a structure on the sidewall of a hole region in FIG. 6 and a resonance principle of the structure.

As illustrated in FIGS. 6 and 7, the light emitting display device according to the third embodiment of the present disclosure has a structure in which both the first and second color converters are omitted.

To this end, a light emitted from the second light emitting element ED2 follows strong cavity conditions when resonating between the upper surface of the third electrode 172 adjacent to the first region P1 on the sidewall surrounding the hole H of the planarization layer 167 and the upper surface of a transflective metal 370 (also referred to as transflective electrode) adjacent to the second region P2. That is, from the second light emitting element ED2, a light constructively interferes between the third electrode 172 and the transflective metal 370 at the same wavelength as the light emitted from the sub-pixel including the first light emitting element ED1 and thus the light from the second light emitting element ED2 is emitted with maximum light emission efficiency. To this end, the distance d between the third electrode 172 and the transflective metal 370 is set to a half-integer multiple ($n\lambda/2$) (n being a positive integer) of the wavelength of the light emitted from the sub-pixel including the first light emitting element ED1, as illustrated in FIG. 7.

Here, the first light emitting element ED1 and the second light emitting element ED2 include an emission layer emitting light of a specific wavelength in the corresponding sub-pixel SP.

In addition, the display device according to the third embodiment further includes the transflective metal 370 on a portion of the sidewall of the hole H of the planarization layer 167 adjacent to the second region P2. The horizontal distance d between the upper surface of the third electrode 172 adjacent to the first region P1 and the upper surface of the transflective metal 370 adjacent to the second region P2 on the sidewall of the hole H of the planarization layer is set to a half-integer multiple ($n\lambda/2$) (n being a positive integer) of the wavelength of light that has passed through the opposing substrate in the first region P1 such that constructive interference in the light the second light emitting element ED2 is generated and emitted out at the time of passing through the hole H of the planarization layer 167 in the horizontal direction. It results in achieving emission of a maximum amount of light. In this case, the emission layer included in the interlayer 180 of the first and second light emitting elements ED1 and ED2 provided in the sub-pixel emits light of a predetermined wavelength. For example, the red sub-pixel includes a red emission layer, the green sub-pixel may include a green emission layer, and the blue sub-pixel may include a blue emission layer.

Here, since the emission layers of the red sub-pixel, the green sub-pixel, and the blue sub-pixel emit different wavelengths of light, the horizontal distance d within the hole H may be different for each sub-pixel. In some cases, the holes H of the planarization layer 167 in the respective sub-pixels may have the same diameter by setting the value n to a common multiple of the red wavelength, the green wavelength, and the blue wavelength.

Here, the third electrode 172 is a reflective electrode, the second electrode 190 is a transparent electrode, and the transflective metal 370 is an electrode having reflective and transmissive properties.

As illustrated in FIG. 7, the transflective metal 370 and the second electrode 190 are short-circuited and the same signal is applied thereto, to electrically stabilize the same. However, the display device according to the third embodiment is not limited thereto, and the transflective electrode 370 may be maintained in a floating state. Even if the transflective electrode 370 is in a floating state, the optical strong cavity conditions can be maintained in the hole H of the planarization layer 167, and the light generated from the second light emitting element ED can pass through the second electrode 190, the interlayer 180, and the transflective electrode 370 disposed on the sidewall of the hole H opposite the transflective electrode 370 to reach the second region P2.

When the display device according to the third embodiment is applied, the color converters can be omitted, and thus the area of the second region P2 or the first region P1 can be increased in the sub-pixel SP to increase the transmittance and reduce power consumption according to increase in light emission efficiency.

The total reflection structure of the display device according to the present disclosure will be described.

Figure 8:
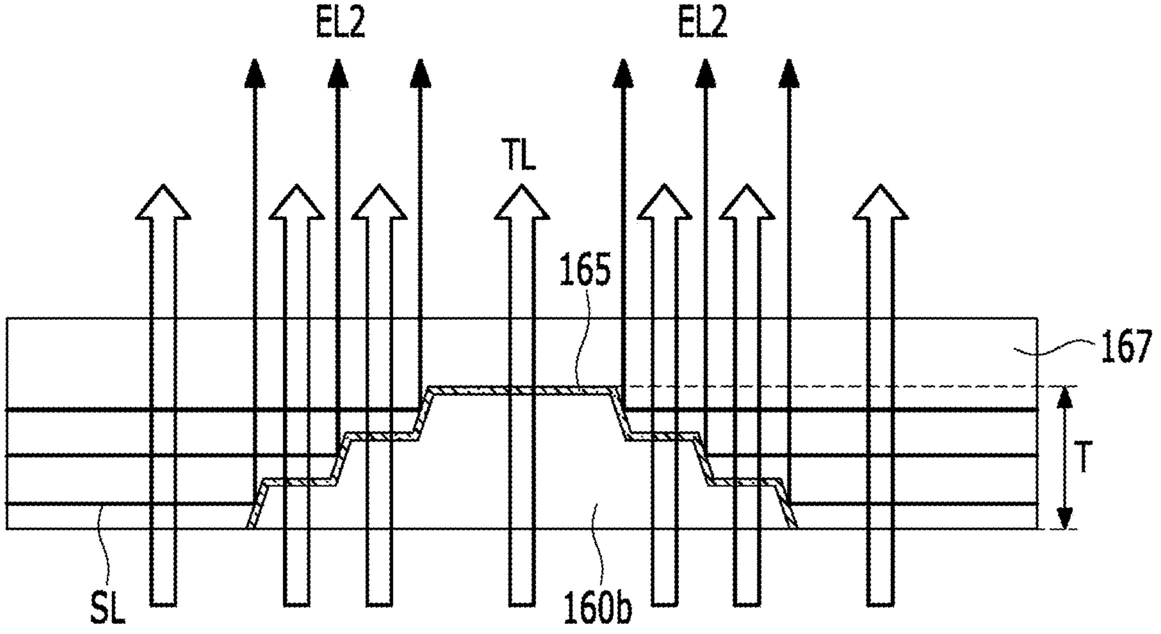
FIG. 8 is a cross-sectional view illustrating a total reflection structure of a second region in a display device according to an embodiment of the present disclosure.
Figure 9:
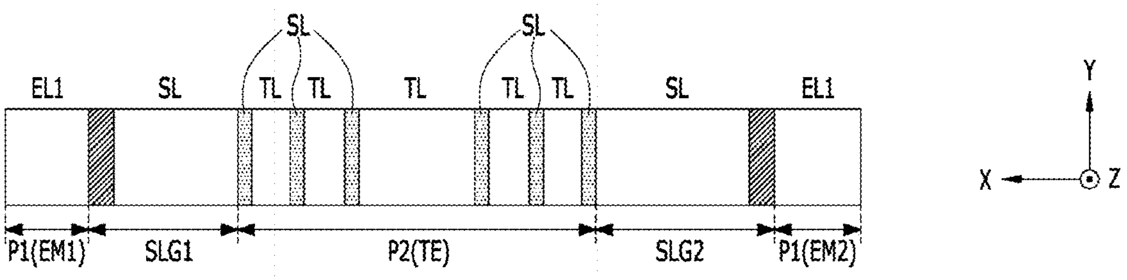
FIG. 9 is a plan view illustrating a light transmission/emission state of a sub-pixel including the total reflection structure of FIG. 8 according to an embodiment of the present disclosure.
Figure 10:
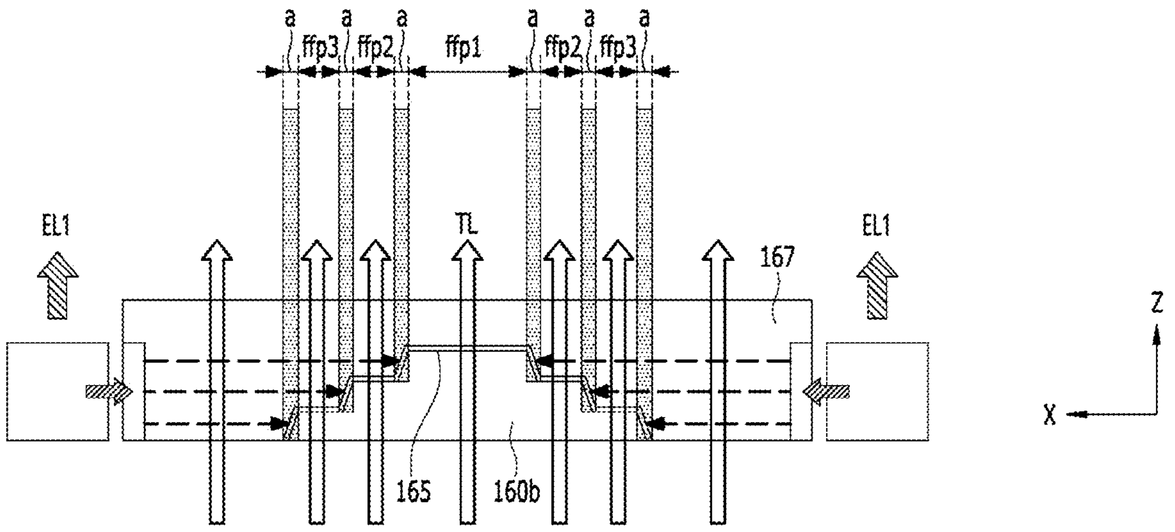
FIG. 10 is a cross-sectional view corresponding to FIG. 9 according to an embodiment of the present disclosure.

FIG. 8 is a cross-sectional view illustrating the total reflection structure of the second region in the display device according to an embodiment of the present disclosure. FIG. 9 is a plan view illustrating a light transmission/emission state of a sub-pixel including the total reflection structure of FIG. 8. FIG. 10 is a cross-sectional view corresponding to FIG. 9.

As illustrated in FIGS. 8 to 10, in the display device of the present disclosure, the total reflection structure is provided in the second region P2. The total reflection structure includes the inclined part 160*b* and the total reflection inducing layer 165 provided on the surface of the inclined part 160*b*, as shown in FIG. 8. The total reflection inducing layer 165 may be covered by the planarization layer 167.

Side light is generated in the side light generation parts SLG1 and SGL2 and transmitted to the second area P2, as illustrated in FIG. 9, and the side light is re-reflected at sloping portions of the inclined part, each having a first width a, in the second region P2 and emitted as the second light EL2, as illustrated in FIG. 10.

The total reflection structure may include the sloping portions to reflect the side light SL upward in the second region P2, and flat portions ffp1, ffp2, and ffp3 disposed between the sloping portions, to increase the transmission efficiency of transmitted light TL from the lower side of the substrate.

Here, the first width of each sloping portion may be less than the width of each of the flat portions ffp1, ffp2, and ffp3, as illustrated in FIG. 10, to increase the amount of transmitted light directed from the bottom to the top of the substrate.

Hereinafter, operation of the display device according to the present disclosure will be described.

Figure 11A:
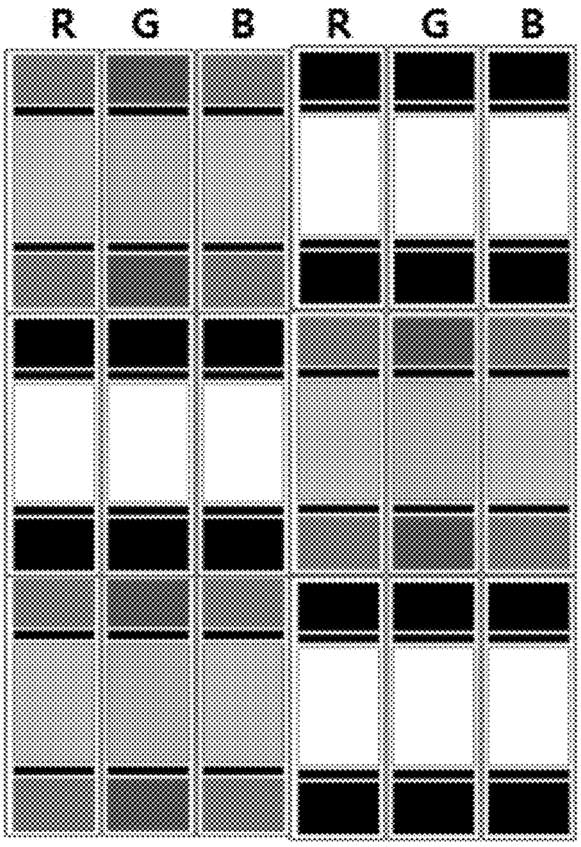
FIGS. 11A and 11B are plan views illustrating light emission/transmission states of sub-pixels when the display device is turned on/off; according to an embodiment of the present disclosure
Figure 11B:
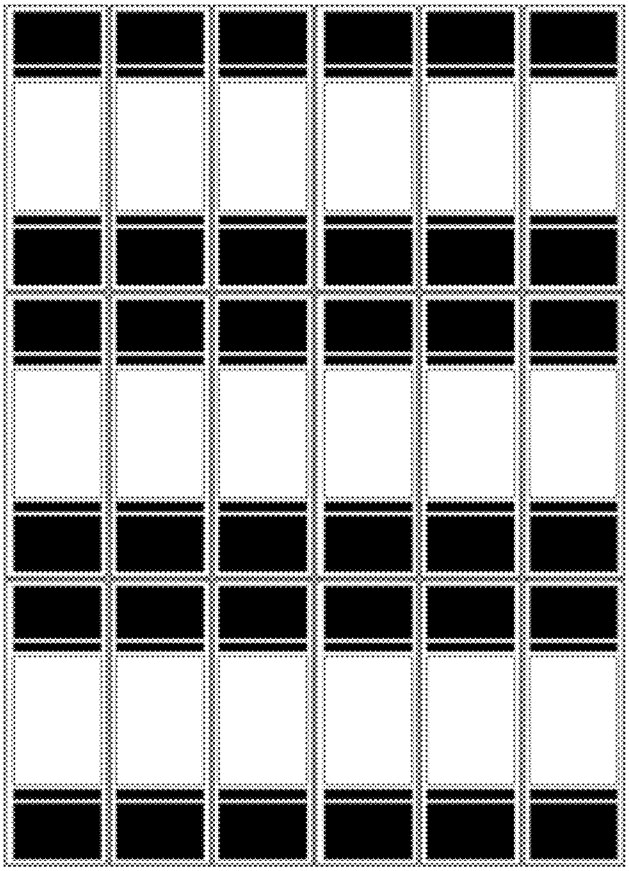

FIGS. 11A and 11B are plan views illustrating light emission/transmission states of sub-pixels when the display device is turned on/off.

As illustrated in FIG. 11A, if the first light emitting element ED1 and the second light emitting element ED2 are simultaneously turned on when the display device of the present disclosure is turned on, all the first regions P1 and second regions P2 of the turned-on sub-pixels emit light, and thus colors corresponding to the respective sub-pixels can be expressed. As compared to a resonant transparent display device in which transmissive parts are not used for light emission, the display device of the present disclosure has an increased light emitting area, thereby increasing luminance and reducing power consumption by luminance increase.

FIG. 11A illustrates a case in which, when one pixel includes a red sub-pixel, a green sub-pixel, and a blue sub-pixel in the display device, pixels in a zigzag direction are turned on.

If all pixels are turned on, both the first and second regions can be used for light emission as all sub-pixels are turned on.

FIG. 11B illustrates a state in which the display device is turned off. At this time, the first region P1 (TE1 and TE2) represents a black state, and the second region P2 represents a transmissive state.

Figure 12A:
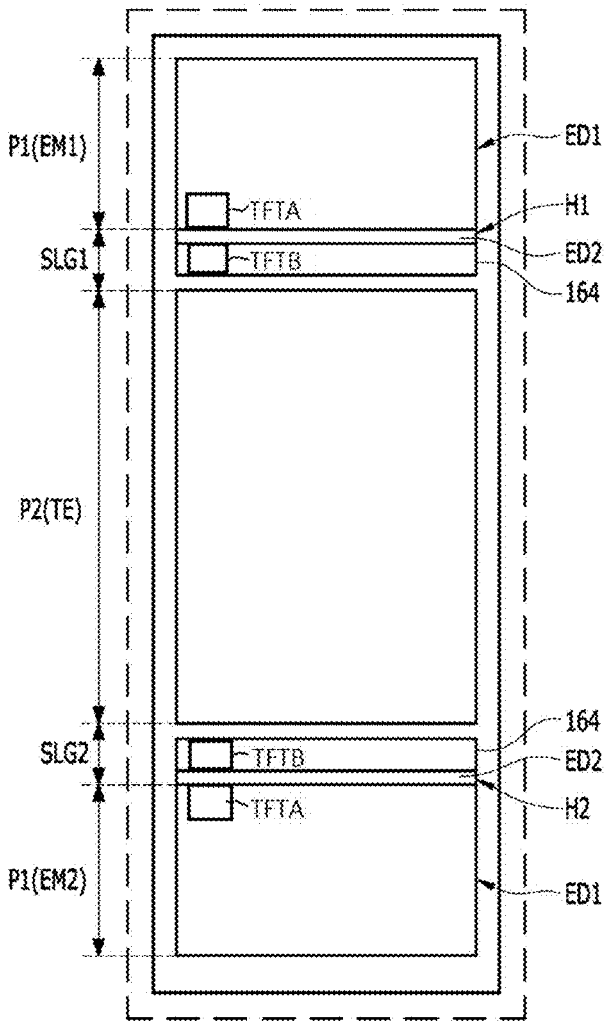
FIGS. 12A and 12B are plan views illustrating connection between thin film transistors of first and second light emitting elements in the display device according to an embodiment of the present disclosure.
Figure 12B:
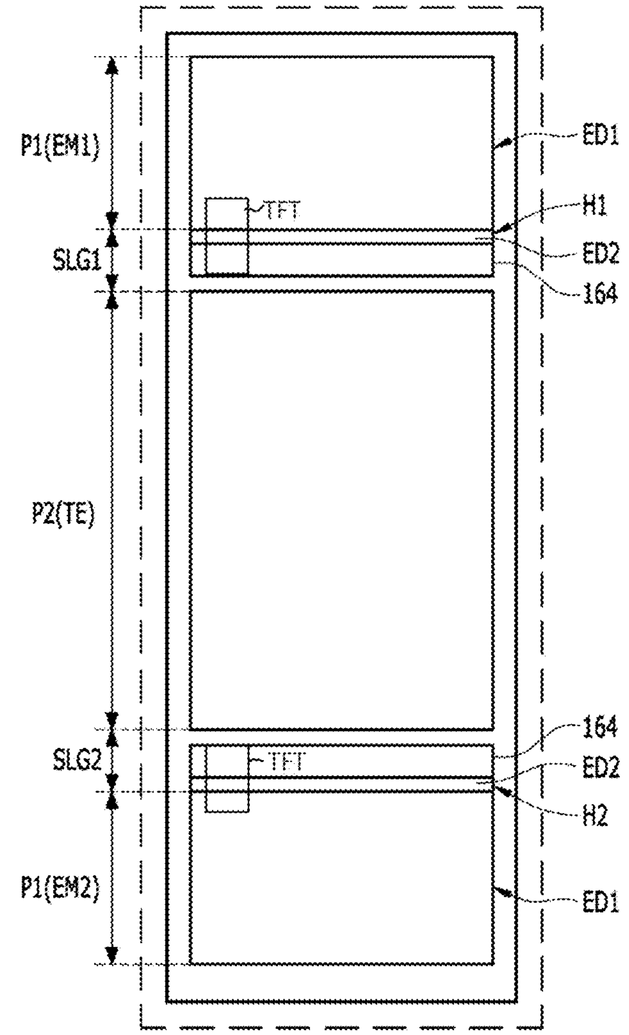

FIGS. 12A and 12B are plan views illustrating connection between thin film transistors of the first and second light emitting elements in the display device according to the present disclosure.

In the display device according to an embodiment of the present disclosure, as illustrated in FIG. 12A, the first light emitting element ED1 is provided in the first region P1, and the second light emitting element ED2 is provided in the side light generation parts SLG1 and SGL2. In this case, as illustrated in FIG. 12A, first and second thin film transistors TFTB and TFTB connected to the first light emitting element ED1 and the second light emitting element ED2 may be provided to independently drive the first light emitting element ED1 and the second light emitting element ED2.

In addition, as illustrated in FIG. 12B, the first and second light emitting elements ED1 and ED2 may be connected to the same thin film transistor TFT to drive the first and second light emitting elements ED1 and ED2 by the same driving signal.

In some cases, one thin film transistor TFT may be provided in a portion of the first region P1 or the side light generation parts SLG1 and SGL2 by connecting the first electrode 171 of the first light emitting element ED1 and the third electrode 172 of the second light emitting element ED2, and the thin film transistor TFT may be connected to the first light emitting element ED1 or the second light emitting element ED2.

In the display device of the present disclosure, since the side light generation parts are included in the display device, the area of the transmissive part can be used as the area of the light emitting part when the light emitting elements are turned on, and thus light emission efficiency can be improved.

A display device according to one or more aspects of the present disclosure may comprise a first region having a first light emitting element emitting light upward on a substrate, a second region spaced apart from the first region on the substrate and including a reflective structure and a side light generation part including a second light emitting element between the first region and the second region, the side light generation part transmitting light to the second region.

In a display device according to one or more aspects of the present disclosure, the first region may comprise a plurality of first regions, and the second region having a transmissive part is disposed between the plurality of first regions.

A display device according to one or more aspects of the present disclosure may further comprise a first color converter on an opposing substrate facing the first region.

A display device according to one or more aspects of the present disclosure may further comprise a planarization layer between the substrate and the first light emitting element and between the substrate and the second light emitting element.

In a display device according to one or more aspects of the present disclosure, the first light emitting element may be provided on the planarization layer. The reflective structure may be covered by the planarization layer. The second light emitting element may be provided on a sidewall of a first hole of the planarization layer.

A display device according to one or more aspects of the present disclosure may further comprise a second color converter on the substrate between the second light emitting element and the reflective structure.

A display device according to one or more aspects of the present disclosure may further comprise a first reflector and a second reflector below and on the second color converter, respectively.

In a display device according to one or more aspects of the present disclosure, the first light emitting element may include a first electrode, a first interlayer, and a second electrode stacked in a vertical direction on the planarization layer. The second light emitting element may be spaced apart from the first electrode and provided on the sidewall of the first hole of the planarization layer adjacent to the first region. The second light emitting element may include a third electrode, a second interlayer, and a fourth electrode sequentially provided on the sidewall.

The first interlayer and the second interlayer may be integrated.

The second electrode and the fourth electrode may be integrated.

In a display device according to one or more aspects of the present disclosure, the first electrode and the third electrode may include a reflective electrode. The second electrode may include a transparent electrode or a transflective electrode.

A display device according to one or more aspects of the present disclosure may further comprise a transflective metal on the sidewall of the first hole of the planarization layer adjacent to the second region.

A horizontal distance between an upper surface of the third electrode adjacent to the first region and an upper surface of the transflective metal adjacent to the second region on the sidewall of the first hole of the planarization layer may be a half-integer multiple ($n\lambda/2$) (n being a positive integer) of a wavelength of light that has passed through the opposing substrate in the first region.

In a display device according to one or more aspects of the present disclosure, the reflective structure may include an inclined part inclined toward the side light generation parts on the substrate, and a total reflection inducing layer having a lower refractive index than the inclined part on the inclined part.

In a display device according to one or more aspects of the present disclosure, the inclined part may include a transparent organic material, and the total reflection inducing layer includes a transparent inorganic material.

In a display device according to one or more aspects of the present disclosure, the inclined part may include a flat portion between sloping portions.

In a display device according to one or more aspects of the present disclosure, a width of each sloping portion may be less than a width of the plurality of flat portion.

In a display device according to one or more aspects of the present disclosure, the first region, the second region, and the side light generation parts may constitute one pixel. A plurality of the pixels are disposed on the substrate.

In a display device according to one or more aspects of the present disclosure, the first light emitting element and the second light emitting element may be connected to the same transistor.

In a display device according to one or more aspects of the present disclosure, the first light emitting element and the second light emitting element may be connected to different transistors.

A transparent display device according to one or more aspects of the present disclosure may comprise a light emitting part having a first light emitting element emitting light upward on a substrate, a transmissive part including a reflective structure spaced apart from the light emitting part on the substrate and side light generation parts including a second light emitting element on the substrate, positioned between the light emitting part and the transmissive part, and transmitting light to the transmissive part.

A transparent display device according to one or more aspects of the present disclosure may further comprise a planarization layer between the substrate and the first light emitting element and between the substrate and the second light emitting element.

In a transparent display device according to one or more aspects of the present disclosure, the first light emitting element may be provided on the planarization layer. The reflective structure may be covered by the planarization layer. The second light emitting element may be provided on a sidewall of a first hole of the planarization layer.

A transparent display device according to one or more aspects of the present disclosure may further comprise a first color converter facing the light emitting part, on an opposing substrate and a second color converter between the second light emitting element and the reflective structure, on the substrate.

In a transparent display device according to one or more aspects of the present disclosure, the first light emitting element may include a first electrode, a first interlayer, and a second electrode stacked in a vertical direction on the planarization layer.

The second light emitting element may be spaced apart from the first electrode and provided on the sidewall of the first hole of the planarization layer adjacent to the light emitting part, and may include a third electrode, a second interlayer, and a fourth electrode sequentially provided on the sidewall.

The first interlayer and the second interlayer may be integrated, and the second electrode and the fourth electrode may be integrated.

In a transparent display device according to one or more aspects of the present disclosure, the first electrode and the third electrode may include a reflective electrode, and the second electrode may include a transparent electrode or a transflective electrode.

A transparent display device according to one or more aspects of the present disclosure may further comprise a transflective metal on the sidewall of the first hole of the planarization layer adjacent to the transmissive part.

A horizontal distance between an upper surface of the third electrode adjacent to the light emitting part and an upper surface of the transflective metal adjacent to the second region on the sidewall of the first hole of the planarization layer may be a half-integer multiple ($n\lambda/2$) (n being a positive integer) of a wavelength of light that has passed through the opposing substrate in the light emitting part.

In a transparent display device according to one or more aspects of the present disclosure, the reflective structure may include an inclined part inclined toward the side light generation parts on the substrate, and a total reflection inducing layer having a lower refractive index than the inclined part on the inclined part.

In a transparent display device according to one or more aspects of the present disclosure, the inclined part may include a transparent organic material, and the total reflection inducing layer includes a transparent inorganic material.

In a transparent display device according to one or more aspects of the present disclosure, the inclined part may include a plurality of flat portions between sloping portions.

A display device according to an embodiment of the present disclosure may include a first region having a first light emitting element emitting light upward on a substrate, a second region spaced apart from the first region on the substrate and including a reflective structure, and side light generation parts including a second light emitting element between the first region and the second region and transmitting light to the second region. A planarization layer may be further provided between the substrate and the first and second light emitting elements.

The first light emitting element may include a first electrode, a first interlayer, and a second electrode laminated in a vertical direction on the planarization layer, and the second light emitting element may be spaced apart from the first electrode and provided adjacent to the first region on a sidewall of a first hole of the planarization layer and may include a third electrode, a second interlayer, and a fourth electrode sequentially provided on the sidewall, wherein the first interlayer and the second interlayer may be integrated, and the second electrode and the second interlayer may be integrated.

The first electrode and the third electrode may include a reflective electrode, and the second electrode may include a transparent electrode or a transflective electrode.

The display device and the transparent display device according to the present disclosure have the following effects.

It is possible to use the region of a transmissive part as the region of a light emitting part when the light emitting part is turned on by configuring side light generation parts in the display device, improving emission efficiency.

By providing the side light generation parts between transmissive parts and light emitting parts, the transmissive parts can maintain the transmittance of light, thereby improving emission efficiency without impairing transmittance.

In addition, since the transmissive parts can be used as a region for improving emission efficiency during light emission, if the area of the light emitting part only used to emit light is reduced and the area of the transmissive part is increased, the transmissive part can emit light in proportion to the reduced area of the light emitting part. In the latter case, transmittance can be increased compared to the structures of known display devices.

In addition, in the display device of the present disclosure, the side light generation parts and the reflective structure are formed using configurations of a light emitting element and a thin film transistor array having material stability, thereby preventing or at least reducing generation of harmful substances and defects caused thereby. Accordingly, it is possible to obtain environment/social/governance (ESG) effects in terms of eco-friendliness, low power consumption, and process optimization.

Furthermore, since the side light generation parts and the reflective structure are provided within a sub-pixel, there is no need to increase the number of components of the array on the substrate and to add a structure to the inside of the display area, and thus the efficiency of the limited area of the display area can be maximized.

It will be apparent to those skilled in the art that various modifications and variations can be made in the present disclosure without departing from the spirit or scope of the disclosure. Thus, it is intended that the present disclosure covers the modifications and variations of this disclosure provided they come within the scope of the appended claims and their equivalents.

What is claimed is:

1. A display device, comprising:

at least one first region on a substrate, the at least one first region having a first light emitting element emitting light upward;

a second region spaced apart from the at least one first region on the substrate, the second region including a reflective structure; and a side light generation part including a second light emitting element between the at least one first region and the second region, the side light generation part transmitting light to the second region, wherein the reflective structure includes an inclined part inclined toward the side light generation part on the substrate and a total reflection inducing layer on the inclined part, the total reflection inducing layer having a lower refractive index than the inclined part.

2. The display device of claim 1, wherein the at least one first region comprises a plurality of first regions, and the second region having a transmissive part is disposed between the plurality of first regions.

3. The display device of claim 1, further comprising a first color converter on an opposing substrate facing the at least one first region.

4. The display device of claim 3, further comprising a second color converter on the substrate between the second light emitting element and the reflective structure.

5. The display device of claim 4, further comprising:

a first reflector below the second color converter, and a second reflector on the second color converter.

6. The display device of claim 1, further comprising a planarization layer between the substrate and the first light emitting element and between the substrate and the second light emitting element.

7. The display device of claim 6, wherein the first light emitting element is on the planarization layer, the reflective structure is covered by the planarization layer, and the second light emitting element is on a sidewall of a first hole of the planarization layer.

8. The display device of claim 7, wherein the first light emitting element includes a first electrode, a first interlayer, and a second electrode stacked in a vertical direction on the planarization layer, the second light emitting element is spaced apart from the first electrode and on the sidewall of the first hole of the planarization layer adjacent to the at least one first region, the second light emitting element including a third electrode, a second interlayer, and a fourth electrode sequentially provided on the sidewall, the first interlayer and the second interlayer are integrated, and the second electrode and the fourth electrode are integrated.

9. The display device of claim 8, wherein the first electrode and the third electrode include a reflective electrode, and the second electrode includes a transparent electrode or a transflective electrode.

10. The display device of claim 8, further comprising a transflective metal on the sidewall of the first hole of the planarization layer adjacent to the second region, wherein a horizontal distance between an upper surface of the third electrode adjacent to the at least one first region and an upper surface of the transflective metal adjacent to the second region on the sidewall of the first hole of the planarization layer is a half-integer multiple ($n\lambda/2$) (n being a positive integer) of a wavelength of light that has passed through an opposing substrate in the at least one first region.

11. The display device of claim 1, wherein the inclined part includes a transparent organic material, and the total reflection inducing layer includes a transparent inorganic material.

12. The display device of claim 1, wherein the inclined part includes a plurality of sloping portions and a flat portion between the plurality of sloping portions.

13. The display device of claim 12, wherein a width of each of the plurality of sloping portions is less than a width of the flat portion.

14. The display device of claim 1, wherein the at least one first region, the second region, and the side light generation part constitute one pixel, and a plurality of pixels are disposed on the substrate.

15. The display device of claim 1, wherein the first light emitting element and the second light emitting element are connected to a same transistor.

16. The display device of claim 1, wherein the first light emitting element and the second light emitting element are connected to different transistors.

17. A transparent display device comprising:

a light emitting part having a first light emitting element emitting light upward on a substrate;

a transmissive part including a reflective structure spaced apart from the light emitting part on the substrate; and side light generation parts including a second light emitting element on the substrate, positioned between the light emitting part and the transmissive part, and transmitting light to the transmissive part, wherein the reflective structure includes an inclined part inclined toward the side light generation parts on the substrate and a total reflection inducing layer on the inclined part, the total reflection inducing layer having a lower refractive index than the inclined part.

18. The transparent display device of claim 17, further comprising a planarization layer between the substrate and the first light emitting element and between the substrate and the second light emitting element.

19. The transparent display device of claim 18, wherein the first light emitting element is provided on the planarization layer, the reflective structure is covered by the planarization layer, and the second light emitting element is provided on a sidewall of a first hole of the planarization layer.

20. The transparent display device of claim 19, wherein the first light emitting element includes a first electrode, a first interlayer, and a second electrode stacked in a vertical direction on the planarization layer, the second light emitting element is spaced apart from the first electrode and provided on the sidewall of the first hole of the planarization layer adjacent to the light emitting part, and includes a third electrode, a second interlayer, and a fourth electrode sequentially provided on the sidewall, the first interlayer and the second interlayer are integrated, and the second electrode and the fourth electrode are integrated.

21. The transparent display device of claim 20, wherein the first electrode and the third electrode include a reflective electrode, and the second electrode includes a transparent electrode or a transflective electrode.

22. The transparent display device of claim 20, further comprising a transflective metal on the sidewall of the first hole of the planarization layer adjacent to the transmissive part, wherein a horizontal distance between an upper surface of the third electrode adjacent to the light emitting part and an upper surface of the transflective metal adjacent to a second region on the sidewall of the first hole of the planarization layer is a half-integer multiple ($n\lambda/2$) (n being a positive integer) of a wavelength of light ($\lambda$) that has passed through an opposing substrate in the light emitting part.

23. The transparent display device of claim 17, further comprising:

a first color converter facing the light emitting part, on an opposing substrate; and a second color converter between the second light emitting element and the reflective structure, on the substrate.

24. The transparent display device of claim 7, wherein the inclined part includes a transparent organic material, and the total reflection inducing layer includes a transparent inorganic material.

25. The transparent display device of claim 7, wherein the inclined part includes a plurality of sloping portions and a plurality of flat portions between the plurality of sloping portions.

* * * * *